US006428716B1

(12) United States Patent
Demmin et al.

(10) Patent No.: US 6,428,716 B1
(45) Date of Patent: Aug. 6, 2002

(54) METHOD OF ETCHING USING HYDROFLUOROCARBON COMPOUNDS

(75) Inventors: Timothy R. Demmin, Grand Island; Matthew H. Luly, Lancaster, both of NY (US); Mohammed A. Fathimulla, Ellicott City, MD (US)

(73) Assignee: AlliedSignal Inc., Morristown, NJ (US)

( * ) Notice: Subject to any disclaimer, the term of this patent is extended or adjusted under 35 U.S.C. 154(b) by 0 days.

(21) Appl. No.: 09/569,910

(22) Filed: May 11, 2000

Related U.S. Application Data

(62) Division of application No. 09/001,755, filed on Dec. 31, 1997, now Pat. No. 6,120,697.

(51) Int. Cl.[7] ............................ G44C 1/22; C03C 15/00
(52) U.S. Cl. ........................ 216/83; 216/216; 216/53; 216/108; 216/109
(58) Field of Search ........................... 216/67, 53, 83, 216/108, 109

(56) References Cited

U.S. PATENT DOCUMENTS

| | | | |
|---|---|---|---|
| 2,904,403 A | 9/1959 | Smith | 23/205 |
| 3,367,745 A | 2/1968 | Tepp | 23/205 |
| 4,181,678 A | 1/1980 | Psarras | |
| 4,181,679 A | 1/1980 | Psarras | |
| 4,260,561 A | 4/1981 | Franz | 260/544 F |
| 4,260,649 A | 4/1981 | Dension et al. | 427/53.1 |
| 4,314,875 A * | 2/1982 | Flamm | 156/643 |
| 4,498,953 A | 2/1985 | Cook et al. | 156/646 |
| 4,836,887 A * | 6/1989 | Daubenspeck et al. | 156/643 |
| 5,118,359 A * | 6/1992 | Li et al. | 134/42 |
| 5,158,617 A * | 10/1992 | Li | 134/40 |
| 5,254,176 A | 10/1993 | Ibuka et al. | 134/2 |
| 5,338,394 A | 8/1994 | Fathimulla et al. | 156/643 |
| 5,376,234 A | 12/1994 | Yanagida | 156/662 |
| 5,445,712 A | 8/1995 | Yanagida | 156/662 |
| 5,534,107 A | 7/1996 | Gray et al. | 156/643.1 |
| 5,545,774 A | 8/1996 | Rao | 570/168 |
| 5,565,038 A | 10/1996 | Ashley | 134/2 |
| 5,574,192 A | 11/1996 | VanDerPuy et al. | 570/167 |
| 5,594,159 A | 1/1997 | Jackson et al. | 570/142 |
| 5,626,775 A | 5/1997 | Roberts et al. | 216/67 |

FOREIGN PATENT DOCUMENTS

| | | | |
|---|---|---|---|
| EP | 0 651 434 A | 5/1995 | |
| EP | 0 670 294 A2 | 9/1995 | C07C/17/361 |
| JP | 6-99358 | 6/1994 | B24D/5/06 |
| WO | WO 98 36449 A | 8/1998 | |

OTHER PUBLICATIONS

Dry Etching, pp. 8–1 to 8–30; Integrated Circuit Engineering Corporation, No date.
IBM J.Res. Develop.—vol. 23—No. 1—Jan. 1979 J.W. Coburn, Eric Kay; Some Chemical Aspects of the Fluorocarbon Plasma Etching of Silicon and Its Compounds.
J.Appl.Phys.56(10) Nov. 1984; American Institute of Physics; pp. 2939–2042; Plasmaless dry etching of silicon with fluorine–containing compounds; Ibbotson et al.
1996 American Vacuum Society; J.Vac.Sci. Technol. A 14(4), Jul./Aug. 1996; pp. 2127–2136; Fluorocarbon high density plasmas. VII. Investigation of selective $SiO_2$ to-$Si_3N_4$ high density plasma etch processes; Ying Zhang et al.
Thin Film Processes; 1978; W. Kern, No. month.
Plasma Etching An Introduction; by Dennis M. Manos & Daniel L. Flamm; 1989; pp. 91–177, No month.
Patent Abstracts Of Japan, vol. 017, No. 203 (E–1354), Apr. 21, 1993 & JP 04 346427 A (Yanagida Toshiharu), Dec. 2, 1992.
Ozoneaction, No. 22, Apr. 1997, XP002099821 ISSN 1020–1602, United Nations Environment Programme Industry and Environment (UNEP IE) Newsletter.
Chae Et Al, "PFC Replacement: Initial DuPont Assessments and Process Studies" Online', XP002099881, No date.

* cited by examiner

Primary Examiner—Archene Turner
(74) Attorney, Agent, or Firm—Deborah Chess

(57) ABSTRACT

A method of etching comprising subjecting a material under plasma etching conditions to an etching composition comprising at least an etchant compound having the formula $C_xH_cF_z$
wherein:

$x=3$, 4 or 5;

$2x \geq z \geq y$;

and $y+z=2x+2$;

and further including an etching composition which includes said etchant compound and a second material different from the etchant compound that enhances or modifies plasma etching.

16 Claims, No Drawings

METHOD OF ETCHING USING HYDROFLUOROCARBON COMPOUNDS

This application is a divisional of U.S. application Ser. No. 09/001,755, filed Dec. 31, 1997, now U.S. Pat. No. 6,120,697.

FIELD OF INVENTION

The present invention relates generally to dry etching and cleaning. More specifically, this invention relates to the use of a family of hydrofluorocarbon compounds for the plasma etching of semiconductor materials.

BACKGROUND OF THE INVENTION

Semiconducting devices are manufactured by the repetitive application of four basic operations to a wafer, namely: layering, patterning/etching, doping, and heat treatments. Of particular interest herein is patterning/etching which involves the selective removal of material from the surface of the wafer. More specifically, material is removed by applying a photoresist to a wafer's surface in a particular geometric pattern selectively and then exposing the wafer to a chemical etchant. Those areas of the wafer that are covered by the photoresist are protected from the etchant, while those that are left exposed are removed to some degree by the etchant. Consequently, material is removed in a geometrical pattern as defined by the photoresist. The term "etching" refers to this selective removal of material.

There are basically two types of etching, wet and dry. Wet etching involves the use of liquid corrosive reagents that react with the unprotected material on the wafer's surface and form soluble products which are then carried away by a solvent. Dry etching refers to plasma and plasma-generated methods which employ energetic gas molecules, ions, and/or free radicals that remove material from a wafer's unprotected surface either chemically by reacting with the material, or physically by bombarding the surface. This plasma process can be used also to clean surfaces of reactors and other apparatus used in the manufacture of semiconductors. Thus, discussion directed to etching and etchants herein applies also to cleaning applications. Other terms commonly applied to these plasma processes include plasma etching, reactive-ion etching, high-density plasma etching, ion milling, reactive ion milling, chemical ion beam etching, and sputter etching. Recently, the industry has been moving away from wet etching and toward dry etching due to the more refined patterning control the latter offers.

As the semiconductor industry moves toward dry etching, environmental concerns grow over the use and disposal of the etching chemicals used and the by-products which are formed. In etching, a portion of the etching chemical tends not to react and exits in the effluent from the reaction, along with various reaction by-products. Venting of such etching chemicals is coming under increased scrutiny.

Traditional etching chemicals, such as, for example, carbon tetrafluoride, hexafluoroethane, perfluoropropane, nitrogen trifluoride, bis(trifluoromethyl) disulfide, and sulfur hexafluoride, and their perfluorinated by-products, such as carbon tetrafluoride and hexafluoroethane, have relatively high Global Warming Potentials. Global Warming Potential (herein "GWP") refers to a compound's ability, relative to $CO_2$, to contribute to global warming. GWP is a calculated value based on a compound's estimated atmospheric lifetime and its ability to absorb infrared radiation. GWPs are reported by the Intergovernmental Panel on Climate Change (IPCC) for different time horizons, with a 100-year horizon being the most common. As used herein, a GWP is based on a 100-year horizon unless otherwise stated. Increasingly, governments and international treaties are requiring that the venting of such high-GWP chemicals be reduced or eliminated. As a consequence of these restrictions, the commercial-availability of these chemicals for semiconductor fabrication is suffering.

Currently, attempts to alleviate the environmental concerns associated with plasma etching and cleaning fall into one of four categories: (1) optimizing etching and/or cleaning processes such that lower amounts of GWP chemicals are emitted into the atmosphere; (2) recycling etching and/or cleaning chemicals from an exhaust stream so that they can be disposed of properly or reused without atmospheric emissions; (3) abating etching and/or cleaning chemicals in exhaust streams by chemical reaction or burn boxes which incinerate and render the unreacted etching and/or cleaning chemical effluents inoffensive, particularly with regard to GWP; and (4) selecting or developing various replacement chemicals for etching and/or cleaning duty. Regarding the first approach, advancements in optimizing the etching and cleaning processes to reduce releases are being made continuously; however, the advancements are not capable of reducing emissions to acceptable levels. Regarding the recycling and abating approaches, although emissions can be reduced, the cost of implementation is relatively high, and, again, the reduction levels still tend to be inadequate. Therefore, replacing the traditional etching chemicals with environmentally-acceptable substitutes appears to be a solution that should be considered.

Accordingly, a need exists for etching compositions which have acceptable performance, but which do not contribute significantly to global warming when by-products or unreacted chemicals are vented to the atmosphere. The present invention fulfills this need among others.

DESCRIPTION OF THE INVENTION AND PREFERRED EMBODIMENTS

The present invention identifies a family of hydrofluorocarbon (HFC) compounds which are useful in plasma etching and which are environmentally acceptable. More specifically, the family of HFC compounds includes compounds having the following formula:

$$C_xH_yF_z \qquad (1)$$

wherein:

x=3, 4 or 5;

$2x \geq z \geq y$;

and y+z=2x+2

These compounds are referred to herein as "etchant compounds." Unlike conventional etching compounds where perfluorocarbons/perfluorochemicals (PFCs) or other highly-fluorinated compounds are preferred for their reactivity, in the present invention, HFC etchant compounds having two or more hydrogen atoms are preferred for their lower GWP and their increased selectivity. As used herein, "selectivity" refers to the ability of an etchant to etch one material at a different etch rate than another material.

One aspect of the invention is the provision of a method for etching using one or more of the above-identified HFC etchant compounds. In a preferred embodiment, the method comprises subjecting a material under plasma etching conditions to an etching composition comprising at least an etchant compound of Formula (1).

Another aspect of the invention is the provision of a composition comprising one or more of the above-identified HFC etchant compounds. In a preferred embodiment, the composition comprises an etchant compound of Formula (1), and another material, different from the etchant compound, to enhance or modify the etching characteristics of the etchant compound.

The various aspects of the present invention relate to the use of the HFC compounds of Formula (1) as etchant compounds. In a preferred embodiment, the HFC etchant compound is fluorinated such that the fluorine to hydrogen ratio is no less than 1.5 ($z \geq 1.5y$). More preferably, the HFC etchant compound is a fluorinated propane (x=3), and still more preferably, the etchant compound is selected from the isomers of hexafluoropropane and pentafluoropropane, wherein z is 6 and 5, respectively. In an even more preferred embodiment, the etchant compound is 1,1,1,3,3,3-hexafluoropropane (herein "HFC-236fa") or 1,1,1,3,3-pentafluoropropane (herein "HFC-245fa"). The most preferred etchant compound is HFC-245fa.

Even though the HFC etchant compounds for use in the present invention have a fluorine to carbon ratio no greater than 2 to 1 (as set forth in Formula (1)) which is less than traditional etchants, it has been found that these etchant compounds, nevertheless, etch a wide variety of materials. In fact, as shown in the examples below, HFC-245fa, which has a fluorine to carbon ratio of 5:3, etches some materials more rapidly than its more-fluorinated counterpart HFC-236fa, which has a fluorine to carbon ratio of 2:1.

Examples of materials that can be etched by the HFC etchant compounds include, but are not limited to: dielectrics such as carbides, borides and silicides of metals or semi-metals, for example, tungsten silicide; insulators, such as oxides, nitrides of metals or semi-metals, for example, silicon dioxide, silicon nitride, silicon oxynitride, boron-phosphorus silicate glass, and fluorosilicate glass; III-V semiconductor compounds such as indium phosphide; elemental materials, such as silicon, polycrystalline silicon, tungsten, titanium, vanadium, germanium, silicon-germanium; and combination of two or more thereof.

It has been found also that the HFC etchant compounds for use in the present invention exhibit good selectivity in response to intentional variations in plasma etching conditions. More specifically, it has been found that the relatively high hydrogen content of the HFC etchant compounds tends to promote polymerization on the surface of certain materials and not others under certain conditions. This polymerization retards etching, thus resulting in selectivity of the non-polymerized surfaces over the polymerized surfaces.

As discussed in greater detail in the examples below, tests were conducted to determine the role operating conditions played in the selectivity of the HFC etchant compounds for use in the present invention. For example, it was found that, for HFC-245fa, relatively high bias and power and low pressure tend to increase the selectivity of $SiO_2$ over Si, and relatively low bias and high pressure and power tend to increase the selectivity of $SiO_2$ over $Si_3N_4$. For HFC-236, relatively low bias and power and high pressure tend to increase the selectivity of $SiO_2$ over Si, and relatively low pressure and power and medium bias tend to increase the selectivity of $SiO_2$ over $Si_3N_4$. Other combinations of operating variables can also be used to impart selectivity over these and other materials as shown in the examples. Additionally, it should be noted that these results are offered only as an indication that selectivity can be achieved by intentionally varying conditions, and should not be construed as an optimization for particular selectivities. Indeed, one skilled in the art should be capable of improving these selectivities as well as other selectivities by optimizing process conditions and the apparatus used.

Accordingly, significant selectivities of $SiO_2$ over Si and $SiO_2$ over $Si_3N_4$, among others, have been achieved by varying operating parameters such as pressure, bias, and power. The importance of such selectivities is discussed, for example, in Zhang et al., *Fluorocarbon High Density Plasmas. VII. Investigation of Selective $SiO_2$-to-$Si_3N_4$ High Density Plasma Etch Processes*, J. VAC. SCI. TECHNOL A14(4) (July/August 1996). In a preferred embodiment, the etching process is performed under conditions such that the etch ratios of $SiO_2$ over Si and/or $SiO_2$ over $Si_3N_4$ are no less than about 2:1, even more preferably no less than about 5:1, and still more preferably no less than about 7:1.

In addition to good reactivity and high selectivity, the HFC etchant compounds for use in the present invention tend to have low GWPs relative to traditional etchants. Traditional etchants are compared below to HFC-245fa, a highly preferred etchant compounds for use in the present invention:

| Etchant | GWP |
| --- | --- |
| HFC-245fa | 790 |
| $SF_6$ | 23900 |
| $CF_4$ | 6500 |
| $C_2F_6$ | 9200 |
| $CHF_3$ | 11700 |

It is clear that HFC-245fa has a significantly lower GWP than traditionally-used etchants. The low-GWP and general environmental-acceptability of these HFC etchant compounds, particularly, HFC-245fa, is important not only from an etching process perspective, but also from a preparation and handling perspective where fugitive emissions are inevitable. In the preferred embodiment, the etching composition of the present composition comprises one or more HFC etchant compounds having a GWP of no greater than 6500, more preferably no greater than 1000, and still more preferably no greater than 800.

The use of the HFC etchant compounds with their generally-low GWP tends to contribute relatively little to the GWP of the etching composition compared to prior art etching compositions which tend to use perfluorinated or other highly-fluorinated etchants. As used herein, the "GWP" of a composition refers to a weighted average of the GWPs of the composition's constituents. For example, a composition comprising by weight 60% of a 1000 GWP compound and 40% of a 500 GWP compound would have a GWP of 800. Preferably, the GWP of the etching composition is no greater than about 5000, more preferably no greater than about 3000, still more preferably no greater than about 1500, even more preferably no greater than about 1000, yet even more preferably no greater than about 750, further more preferably no greater than about 200.

The HFC etchant compounds for use in the present invention also tend to be consumed with such efficiency that relatively little unreacted material exits in the reaction effluent. Additionally, during plasma etching, these compounds dissociate and/or react producing a low-GWP effluent. The effluent GWP refers to a weighted average of the GWPs of the effluent's constituents. In the preferred embodiment, the more hydrogenated etchant compounds for use in the present-invention are less likely than PFC compounds or other highly-fluorinated traditional etchant compounds to produce high-GWP reaction products, such as $C_2F_6$. Preferably, the effluent comprises no greater than about 25 molar % of $C_2F_6$, even more preferably no greater than about 15 molar % of $C_2F_6$, and still more preferably no greater than about 5 molar % of $C_2F_6$. Preferably, the effluent has a GWP of no greater than about 5000, more preferably no greater than about 3000, still more preferably no greater than about 1500, even more preferably no greater than about 1000, yet even more preferably no greater than about 750, and further more preferably no greater than about 200.

Therefore, due to the relatively-low GWP of the HFC etchant compounds and the relatively-low GWP of their effluent, the compositions of the present invention can be used with lessened fear of contributing to global warming and without implementing complex and costly capture/recycle and/or abatement systems.

The HFC etchant compounds for use in the present invention are commercially available or can be readily synthesized from commercially-available starting materials. For example, U.S. Pat. No. 5,594,159, issued to Jackson et al., teaches a method of preparing hexafluoropropane (HFC-236) by the reaction of water and $(CF_3)_2CHCO_2H$. U.S. Pat. No. 5,545,774, issued to Rao, teaches a process for producing HFC-236fa by the reaction of hydrogen fluoride and hexachloropropane in the presence of a trivalent chromium supported on carbon catalyst. Additionally, U.S. Pat. No. 5,574,192, issued to Van Der Puy et al., teaches the preparation of HFC-245fa by the fluorination of hydrofluorochlorocarbons. HFC-245fa is available commercially through AlliedSignal Inc. (Morristown, N.J.).

The amount of etchant compound(s) in the etching composition should be sufficient to impart the desired degree of etching capability. It is believed that, for most applications, the concentration of the etchant compound in the etching composition should be no less than about 0.1% by volume. Preferably, the etchant compound in the etching composition should comprise by volume no less than about 1%, and more preferably no less than about 5%.

The composition of the present invention may comprise other constituents in addition to one or more etchant compounds of Formulas (1). These additional constituents may be used to aid etching or, in the case of etchant-modifiers, impart additional selectivity. Etchant-modifiers and their effects are well known in the art (see, for example, Zhang et al. supra). Consequently, one skilled in the art can determine the types and amounts of etchant-modifiers to use to achieve a desired selectivity.

For example, the addition of hydrogen and/or hydrogen-containing compounds, such as hydrocarbons and hydrofluorocarbons, to the etching composition tends to enhance polymerization on the surface of certain materials and not others. In a similar fashion the addition of nitrogen to the etching composition tends to alter the chemistry of the plasma reaction thereby increasing polymerization on certain surfaces. Other compounds such as oxygen tend to increase the etch rate of oxygen-containing materials such as $SiO_2$.

In a preferred embodiment, the etchant-modifier comprises a compound selected from the group consisting of $O_2$, $H_2$, $N_2$, $C_1$–$C_5$ hydrocarbons, $C_1$–$C_5$ HFC compounds different from the HFC etchant compound, $C_1$ $C_4$ perfluorocarbon compounds, and a fluorinated carbonyl compound having a formula selected from the group consisting of F—CO—[$(CR^1R^2)_m$—CO]$_n$—F and F—CO—$R^3$—CO—F, and wherein:

m=1, 2, 3, 4, or 5;
n=0 or 1;
$R^1$ & $R^2$ represent H, F or $C_aH_bF_c$; wherein:
  a=1 or 2; and
  b+c=2a+1;
$R^3$ represents $CR^4$=$CR^5$, $R^6R^7C$=C or C≡C; wherein:
  $R^{4-7}$ represent H, F, or $C_aH_bF_c$; wherein:
    a=1 or 2; and
    b+c=2a+1; and
wherein at least one of $R^1$, $R^2$, and $R^{4-7}$ is hydrogen or hydrogen containing. More preferably, the etchant-modifier is $O_2$, $H_2$, $N_2$, $CH_4$, $CF_4$, pentafluoroethane, and isomers of tetrafluoroethane.

The amount of etchant-modifier present in the etching/cleaning composition should be sufficient to impart the desired additional selectivity between materials. It is believed that, for most applications, effective additional selectivity can be obtained with an etching composition comprising by volume from about 0.1 to about 99%, and more preferably, from about 5 to about 60% of the etchant-modifier.

It may be preferable also to include other constituents in the etching composition. For example, it may be beneficial to introduce the etchant compound into the etching apparatus using an entraining carrier gas, such as argon, helium or mixtures thereof, especially to impart volatility to etching composition which have low vapor pressure (alternatively, liquid-feed systems may be employed to introduce low-vapor pressure etching compositions). In addition, it may be desirable to add a high ionization energy gas, such as, for example, argon, helium, or mixtures thereof to the process to enhance ion bombardment of the material's surface.

The amount of entraining carrier gas or high energy gas present in the etching/cleaning composition should be sufficient to impart the desired volatility or additional ion concentration. It is believed that, for most applications, suitable results will be obtained with an etching composition comprising by volume from about 0.1 to about 99% and, preferably, from about 40 to about 95% of the carrier or high energy gas.

In effecting the etching method of the present invention, conventional apparatus and techniques can be employed. Generally, to etch a substrate, one or more wafers are placed in a chamber and the pressure is reduced by a vacuum pump. A plasma is formed by introducing a suitable etching composition into a low-pressure chamber and then applying an RF field to the contents in the chamber. In this state, the energized species of the etching composition attack the material to be removed either physically by bombarding the surface or chemically by forming a volatile material, such as $SiF_4$, which can be pumped from the vacuum chamber. The process is stopped when the desired amount of material has been removed from the wafer surface. An overview of plasma etching is provided in W. KERN, THIN FILM PROCESS (1978) and in PLASMA ETCHING & INTRODUCTION (B. M. Manos et al. eds. 1989).

As is well known, there are many operating conditions of a plasma etching process that can have an effect on the results obtained. These conditions include, for example, the type of plasma etching (for example, reactive ion etching, plasma etching, and high-density etching), etching composition flow rate, wafer temperature, pressure, power, time, and bias. The interrelationship of these parameters is a function of the hardware configuration and the material being etched. One skilled in the art of plasma etching and cleaning can vary these parameters accordingly to etch a desired material satisfactorily. Exemplary operating conditions include etching gas flow rates from about 1 to about 500 standard cubic centimeters per minute (sccm); wafer temperatures from about −200 to about 200° C.; pressures from about 0.05 to about 500 mTorr; power from about 20 to about 5000 watts; and a bias voltage across the wafer or article being etched ranging from about 1 to about 500 volts DC. The time of etching depends upon the desired amount of material to be removed and ranges from seconds to hours. In the use of HFC-245fa and HFC-236fa, it has been found that effective etching can be achieved using an electron cyclotron resonance (ECR) etcher with an etching gas flow rate of about 1 to about 200 sccm, preferably about 5 to about 100 sccm; a pressure of about 0.05 to about 50 mTorr, preferably about 0.1 to about 20 mTorr; a wafer temperature of about 0 to about 150° C., preferably about room temperature; power from about 100 to about 1000 watts, preferably about 300 to about 700 watts; and a bias of about 10 to about 200 volts DC, preferably from about 25 to about 175 volts DC.

The following examples are illustrative of the practice of the present invention.

EXAMPLES

Examples 1–8

Examples 1–8 show the etching capability of HFC-245fa on various materials under different operating conditions. The specific conditions and average etch rates are set forth in Table 1 below.

Tests were performed in a lock load Plasma Therm electron cyclotron resonance (ECR) etcher with an ASTeX® source using wafers layered with different materials. In each experiment, wafers of single crystal silicon, polysilicon (10,000 Å thick, LPCVD deposited on a $SiO_2$ coated Si wafer), silicon dioxide (5000 Å thick, LPCVD deposited on a Si wafer), and silicon nitride (5000 Å thick, LPCVD deposited on Si wafer) were placed in the chamber. A mass flow meter was used to introduce a continuous flow of 2 sccm of HFC-245fa with 20 sccm of Argon. The wafer temperature was about room temperature. In each test, etching was stopped after 5 minutes and the amount of material removed was measured at seven positions on each wafer by ellipsometry and the etch rate was calculated based on the average amount of material removal. Table 1 below shows the results.

TABLE 1

Etch Conditions, Average Etch Rates, and Selected Etch Ratios for HFC-245fa

| | | | Power | Etch rate (Å/min) | | | | Selected Etch Ratios | | |
|---|---|---|---|---|---|---|---|---|---|---|
| Ex No | DC Bias (volts) | Press (mTorr) | (watts @ 2.45 GHz) | Si | Poly Si | $SiO_2$ | $Si_3N_4$ | $SiO_2$ over Si | $SiO_2$ over $Si_3N_4$ | $SiO_2$ over Poly Si |
| 1 | 63 | 1 | 350 | <100 | 28.6 | 116 | 130 | >1.16 | 0.89 | 4.05 |
| 2 | 125 | 1 | 710 | 31.4 | 172 | 230 | 263 | 7.32 | 0.88 | 1.34 |
| 3 | 62 | 5 | 700 | 141.4 | 129 | 293 | 38.6 | 2.07 | 7.59 | 2.28 |
| 4 | 125 | 5 | 350 | 220 | 191 | 230 | 271 | 1.05 | 0.85 | 1.20 |
| 5 | 60 | 1 | 700 | 81.4 | 32.8 | 183 | 233 | 2.25 | 0.79 | 5.57 |
| 6 | 120 | 1 | 350 | 179.7 | 167 | 187 | 249 | 1.04 | 0.75 | 1.12 |
| 7 | 64 | 5 | 350 | * | 31.4 | 180 | 213 | very high | 0.84 | 5.72 |
| 8 | 120 | 5 | 700 | 384.9 | 349 | 367 | 280 | 0.95 | 1.31 | 1.05 |

*No measurable etching

These tests show that materials commonly used in the fabrication of semiconductors are efficiently etched by plasma etching using HFC-245fa. Furthermore, the results indicate that etching can be performed successfully under a wide variety of conditions, and that these conditions can be changed to achieve desired results. For example, selectivity ratios for $SiO_2$ over Si of about 0.9 to about 7.3; for $SiO_2$ over $Si_3N_4$ of about 0.8 to about 7.5; and for $SiO_2$ over Poly Si of about 1 to about 5.7 were obtained by varying DC bias from about 60 to about 120, pressure from about 1 to about 5 mTorr, and power from about 350 to about 700 watts.

Examples 9–18

Examples 9–18 show the etching capability of HFC-236fa on various materials under different operating conditions. The specific conditions and average etch rates are set forth in Table 2 below. The tests were performed in the same manner as described in Examples 1–8.

TABLE 2

Etch Conditions, Average Etch Rates, and Selected Etch Ratios for HFC-236fa

| | | Power | | | | | | Selected Etch Ratios | | |
|---|---|---|---|---|---|---|---|---|---|---|
| | DC | | (watts @ | Etch rate (Å/min) | | | | $SiO_2$ | $SiO_2$ | $SiO_2$ |
| Ex No | Bias (volts) | Press (mTorr) | 2.45 GHz) | Si | Poly Si | $SiO_2$ | $Si_3N_4$ | over Si | over $Si_3N_4$ | over Poly Si |
| 9  | 48  | 1 | 350 | 42  | 44  | 45  | *   | 1.06 | —    | 1.0227 |
| 10 | 35  | 1 | 700 | **  | **  | *** | *** | —    | —    | —      |
| 11 | 84  | 5 | 350 | *   | 70  | 505 | 235 | —    | 2.15 | 7.21   |
| 12 | 43  | 5 | 700 | 21  | 24  | *   | *   | —    | —    | —      |
| 13 | 104 | 1 | 700 | 219 | 238 | 247 | 321 | 1.13 | 0.77 | 1.04   |
| 14 | 135 | 5 | 350 | 151 | 221 | 327 | 327 | 2.17 | 1.00 | 1.48   |
| 15 | 100 | 5 | 700 | 180 | 202 | 396 | 393 | 2.20 | 1.01 | 1.96   |
| 16 | 34  | 5 | 350 | 71  | 110 | 166 | 204 | 2.34 | 0.81 | 1.51   |
| 17 | 130 | 1 | 350 | 137 | 248 | 277 | 312 | 2.02 | 0.89 | 1.12   |
| 18 | 120 | 5 | 700 | 300 | 340 | 386 | 245 | 1.29 | 1.57 | 1.14   |

*No measurable etching
**Deposition
***Trenching

As above, these tests show that materials commonly used in the fabrication of semiconductors are efficiently etched by plasma etching using HFC-236fa. Furthermore, the results indicate that etching can be performed successfully under a wide variety of conditions, and that these conditions can be changed to achieve desired results. For example, selectivity ratios for $SiO_2$ over Si of about 1.0 to about 2.3; for $SiO_2$ over $Si_3N_4$ of about 0.8 to about 2.1; and for $SiO_2$ over Poly Si of about 1 to about 7.2 were obtained by varying DC bias from 34 to about 135, pressure from about 1 to about 5 mtorr, and power from about 350 to about 700 watts.

What is claimed is:

1. A method of etching comprising subjecting a material under plasma etching conditions to an etching composition comprising at least:

an etchant compound having the formula $C_xH_yF_z$, wherein:

x=3, 4 or 5;

$2x \geq z \geq y$;

and y+z=2x+2;

and a second material, different from the etchant compound, to enhance or modify the plasma etching characteristics of the etchant compound, wherein said second material is selected from the group consisting of $O_2$, $H_2$, $N_2$, $CH_4$, He, Ar, and $C_1$–$C_5$ hydrofluorocarbons.

2. The method of claim 1, wherein $z \geq 1.5y$.

3. The method of claim 2, wherein x=3.

4. The method of claim 3, wherein said hydrofluorocarbon etchant compound is selected from the isomers of hexafluoropropane.

5. The method of claim 4, wherein said hydrofluorocarbon etchant compound is 1,1,1,3,3,3-hexafluoropropane.

6. The method of claim 3, wherein said hydrofluorocarbon etchant compound is selected from the isomers of pentafluoropropane.

7. The method of claim 6, wherein said hydrofluorocarbon etchant compound is 1,1,1,3,3-pentafluoropropane.

8. The method of claim 1, wherein said hydrofluorocarbon etchant compound has a GWP of no greater than about 1000.

9. The method of claim 1, wherein said etching composition has a GWP of no greater than about 1000.

10. The method of claim 9, wherein said etching composition has a GWP of no greater than about 750.

11. The method of claim 1, wherein the etch ratio of SiO to $Si_3N_4$ is no less than about 2:1.

12. The method of claim 11, wherein the etch ratio of $SiO_2$ to $Si_3N_4$ is no less than about 7:1.

13. A method of etching comprising:

introducing an etching composition to an etching apparatus containing a material to be etched, subjecting said material to said etching composition under plasma etching conditions, said etching composition comprising at least:

a hydrofluorocarbon etchant compound having the formula $C_xH_yF_z$, wherein:

x=3, 4 or 5;

$2x \geq z \geq y$;

and y+z=2x+2.;

and a second material, different from the etchant compound, to enhance or modify the plasma etching characteristics of the etchant compound, wherein said second material is selected from the group consisting of $O_2$, $H_2$, $N_2$, $CH_4$, He, Ar, and $C_1$–$C_5$ hydrofluorocarbons; and allowing an effluent to leave said etching tool, said effluent having a molar % of $C_2F_6$ of no greater than about 25.

14. The method of claim 13, wherein said effluent has a molar % of $C_2F_6$ of no greater than about 15.

15. A method of etching comprising:

introducing an etching composition to an etching apparatus containing a material to be etched, subjecting said material to said etching composition under plasma etching conditions, said etching composition comprising at least:

a hydrofluorocarbon etchant compound having the fonrula $C_xH_yF_z$, wherein:

$x = 3, 4$ or $5$;

$2x \geq z \geq y$;

and $y + z = 2x + 2$.;

and a second material, different from the etchant compound, to enhance or modify the plasma etching characteristics of the etchant compound, wherein said second material is selected from the group consisting of $O_2$, $H_2$, $N_2$, $CH_4$, He, Ar, and $C_1$–$C_5$ hydrofluorocarbons; and allowing an effluent to leave said etching tool, said effluent having a GWP of no greater than about 5000.

16. The method of claim 15, wherein said effluent has a GWP of no greater than about 1000.

* * * * *